United States Patent
Sen et al.

(10) Patent No.: US 8,983,803 B2
(45) Date of Patent: Mar. 17, 2015

(54) TOLERANT INTERSECTIONS IN GRAPHICAL MODELS

(75) Inventors: Avijit Sen, Pune (IN); Amit Ashok Inamdar, Pune (IN); Shriganesh Borse, Nashik (IN); Jeet Trivedi, Ahmedabad (IN); Show T. Wang, Huntington Beach, CA (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 421 days.

(21) Appl. No.: 13/224,980

(22) Filed: Sep. 2, 2011

(65) Prior Publication Data

US 2013/0060530 A1 Mar. 7, 2013

(51) Int. Cl.
*G06F 17/50* (2006.01)
*G06T 17/10* (2006.01)

(52) U.S. Cl.
CPC ............ *G06F 17/50* (2013.01); *G06T 17/10* (2013.01)
USPC .......................................................... 703/1

(58) Field of Classification Search
None
See application file for complete search history.

(56) References Cited

U.S. PATENT DOCUMENTS

| 5,455,896 | A * | 10/1995 | Takamura ............... 345/419 |
| 6,629,065 | B1 * | 9/2003 | Gadh et al. .............. 703/1 |
| 8,289,332 | B2 * | 10/2012 | Dokken et al. ........... 345/502 |
| 2009/0135181 | A1 | 5/2009 | Chang et al. |

OTHER PUBLICATIONS

Gursoz, E. L.; Choi, Y; Prinz, F; CMU Engineering Design Research Center., "Non-regularized Bollean Set Operations on Non-Manifold B-rep Objects" (1990).*
"RhinoPython CurveCurveIntersection Function" accessed on Oct. 17, 2014 from <http://rhinopython-docs.appspot.com/functions/curvecurveintersection.html>.*
Wayback Machine WebArchive of "PyMEL v0.9.1 Documentation—curveIntersect( )" (Sep. 13, 2010) available from <http://web.archive.org/web/20100913021041/http://pymel.googlecode.com/svn/docs/generated/functions/pymel.core.modeling/pymel.core.modeling.curveIntersect.html>.*
GZero "CurveIntersection Problem in C#—Grasshopper" (Oct. 14, 2010) available at <http://www.grasshopper3d.com/forum/topics/curveintersection-problem-in-c>.*
Sederberg, T.W. "Computer Aided Geometric Design Course Notes: Chapter 7" (2007) available at <http://www.tsplines.com/technology/edu/CurveIntersection.pdf>.*
Kinch, Richard "Finding All Intersections of Two Bezier Curves" Wayback Machine web archive (Jul. 11, 2010) available at <http://web.archive.org/web/20100711080040/http://www.truetex.com/bezint.htm>.*
Siemens, "Parasolid XT Format Reference", Apr. 2008, Cambridge UK, 137 pages.

(Continued)

*Primary Examiner* — Kamini S Shah
*Assistant Examiner* — Jay B Hann (57) ABSTRACT

Methods for analysis and classification of tolerant intersections, and corresponding systems and computer-readable mediums. A method includes receiving an object model having a plurality of elements, the elements corresponding to a plurality of points. The method includes receiving a selection of a first element and a second element of the plurality of elements and receiving a tolerance. The method includes analyzing an intersection between the first element and the second element based on the tolerance. The method includes classifying the intersection between the first element and the second element based on the analysis and storing the classification.

11 Claims, 8 Drawing Sheets

(56) References Cited

OTHER PUBLICATIONS

PCT International Search Report mailed Nov. 13, 2012 in connection with PCT International Application No. PCT/US2012/053338 filed Aug. 31, 2012 (5 pages).

Written Opinion of the International Searching Authority mailed Nov. 13, 2012 in connection with International Application No. PCT/US2012/053338 (5 pages).

Fang et al, "Robustness in Solid Modelling: A Tolerance-Based Intuitionistic Approach", Computer Aided Design, Elsevier Publishers V 25, No. 9, Sep. 25, 1993, pp. 567-576, GB.

Martti Mantyla: "Boolean Operations of 2-Manifolds through Vertex Neighborhood Classification", ACM Transactions on Graphics, V. 5, No. 1, Jan. 1, 1986, pp. 1-29.

* cited by examiner

TOLERANT INTERSECTIONS IN GRAPHICAL MODELS

TECHNICAL FIELD

The present disclosure is directed, in general, to computer-aided design, visualization, and manufacturing systems, product lifecycle management ("PLM") systems, and similar systems, that manage and display graphic models (individually and collectively, "CAD systems").

BACKGROUND OF THE DISCLOSURE

CAD systems are useful for designing, editing, managing, and visualizing graphic models. Improved systems are desirable.

SUMMARY OF THE DISCLOSURE

Various disclosed embodiments include methods for analysis and classification of tolerant intersections, and corresponding systems and computer-readable mediums. A method includes receiving an object model having a plurality of elements, the elements corresponding to a plurality of points. The method includes receiving a selection of a first element and a second element of the plurality of elements and receiving a tolerance. The method includes analyzing an intersection between the first element and the second element based on the tolerance. The method includes classifying the intersection between the first element and the second element based on the analysis and storing the classification.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

FIGS. 1 through 14, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Various embodiments include systems and methods to classify intersections between two curves. A CAD modeler always works in context of tolerances between features of the model. Tolerance is a small value that defines the limits of allowable variation in the model. The value of the tolerance is used to decide whether two points in 3D space are coincident. Any intersection is also found within this specified tolerance. The inclusion of tolerance increases the complexity because even for a "simple" intersection, e.g., between two coplanar straight lines intersecting at a single point, there is a region in the vicinity of the mathematical intersection which falls within this specified tolerance.

Disclosed embodiments include systems and methods for classification, management, manipulation, and display of intersections in a graphic model, with particular advantages with regard to curve-curve intersections.

Figure 1:
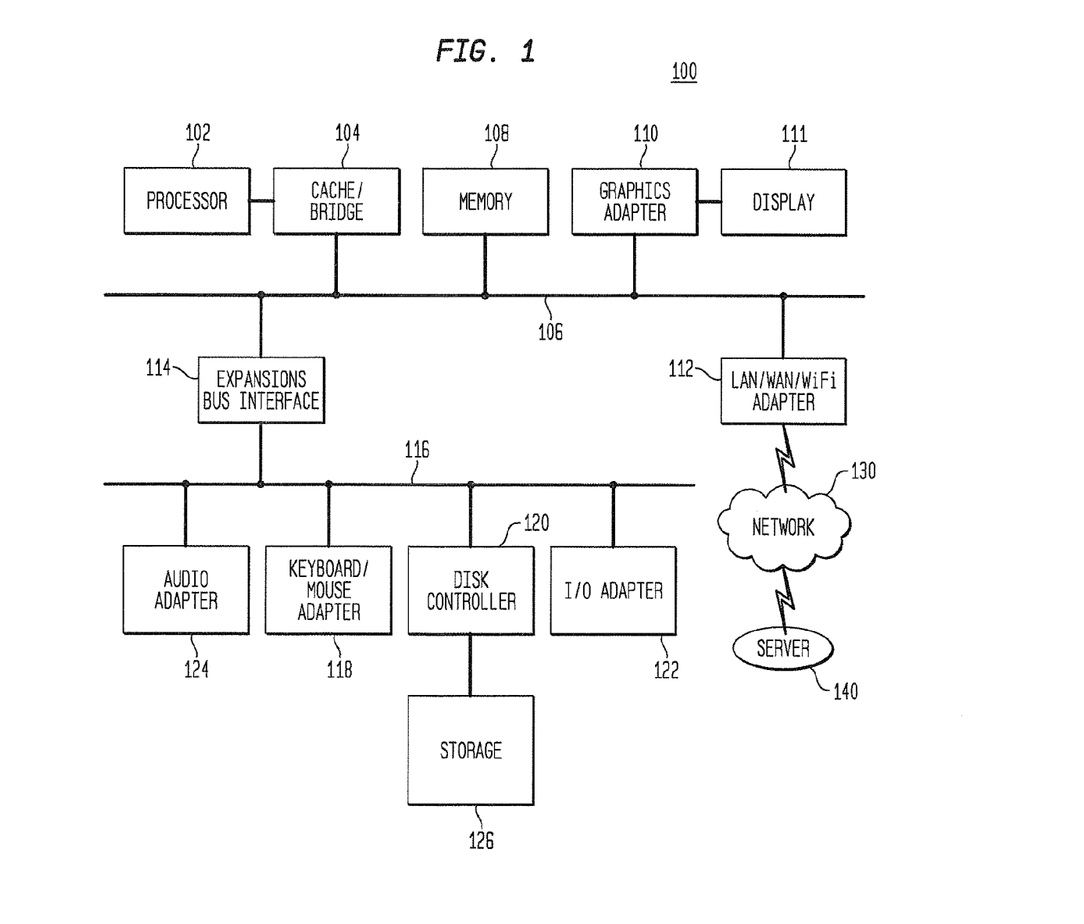
FIG. 1 depicts a block diagram of a data processing system in which an embodiment can be implemented.

FIG. 1 depicts a block diagram of a data processing system in which an embodiment can be implemented, for example as a CAD system particularly configured by software or otherwise to perform the processes as described herein, and in particular as each one of a plurality of interconnected and communicating systems as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Various embodiments use consistent and clear classification strategies for curve-curve intersections that greatly reduce the complexity of the downstream algorithms and also results in better update robustness of the resulting CAD model.

Figure 2:
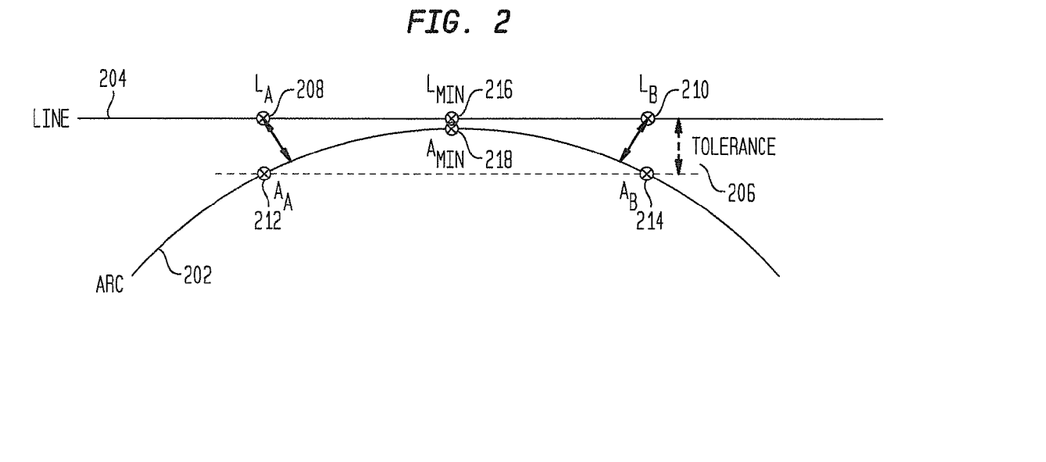
FIG. 2 shows an example of two coplanar curves.

Ensuring consistent intersections is difficult in conventional systems because of the presence of a tolerance. FIG. 2 shows an example of two coplanar curves, in this case an arc 202 and a line 204 (both of which can be considered "curves").

These two elements do not have a mathematical intersection between them, but substantial portions on both curves lie within the specified tolerance 206 from one another. The portion on the Line between points LA 208 and LB 210 is within the specified tolerance from the arc 202. Similarly, the portion on the arc 202 between points AA 212 and AB 214 are within the specified tolerance from the line 204. If tolerance is to be honored strictly, any intersection-calculation algorithm has to return all the points in these portions as intersection points. However, for this case, the intersection analysis is concerned with points Lmin 216 and Amin 218 on the line 204 and arc 202, respectively, where the distance between these two curves is numerically minimum. As long as this distance is within the specified tolerance, these indicate the intersection points on the respective curves.

Disclosed embodiments always ensure the return of these points for such situations. Disclosed embodiments also differentiate this situation from a case where adjacent portions of two curves actually have extended overlaps, i.e., there is no single minimum of interest. The systems and methods disclosed herein result in more consistent intersection results in a CAD modeling.

Consider two curves defined in their parametric form. The parametric equations for the curves are given below.

$$x = fx_1(t_1)$$

$$y = fy_1(t_1)$$

$$z = fz_1(t_1)$$

where $t_1$ varies from $t_{1min}$ to $t_{1max}$ $$x = fx_2(t_2)$$

$$y = fy_2(t_2)$$

$$z = fz_2(t_2)$$

where $t_2$ varies from $t_{2min}$ to $t_{2max}$

Figure 3:
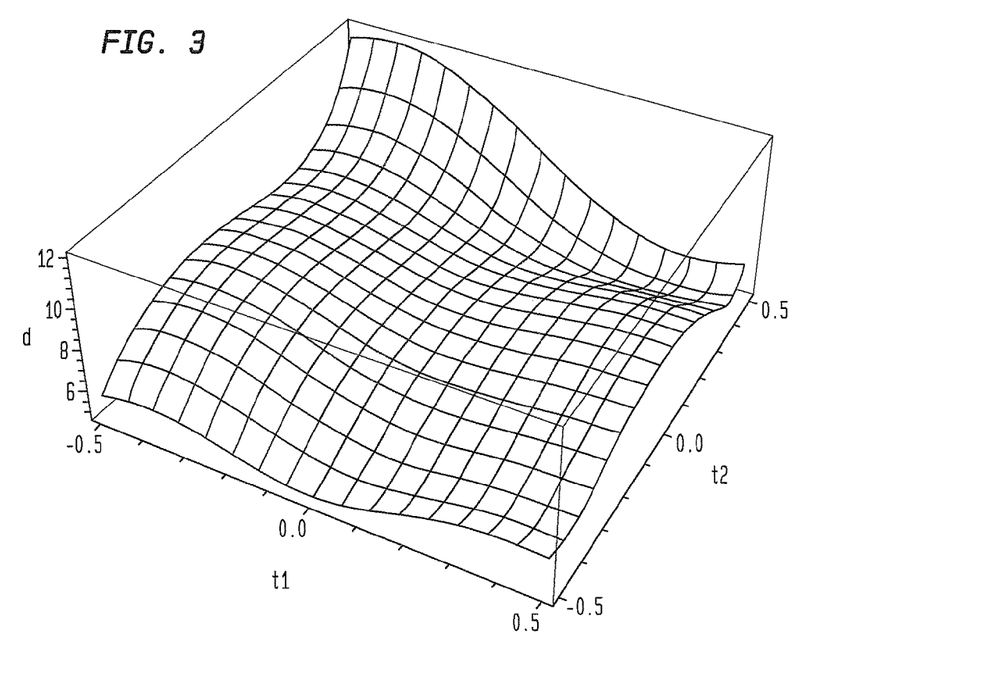
FIG. 3 illustrates a 3D plot of distance and parametrization of two curves.

Disclosed embodiments find intersections between these two curves by finding all distances between a pair of points on each of the curves that are less than the specified tolerance. The distance between two specific points on each of the curves is as below.

$$d = \sqrt{[fx_1(t_{1c}) - fx_2(t_{2c})]^2 + [fy_1(t_{1c}) - fy_2(t_{2c})]^2 + [fz_1(t_{1c}) - fz_2(t_{2c})]^2}$$

where $t_{1c}$ is a constant parameter between $t_{1min}$ and $t_{1max}$
and $t_{2c}$ is a constant parameter between $t_{2min}$ and $t_{2max}$ FIG. 3 illustrates a 3D plot of the distance for all possible values of $t_1$ and $t_2$, and in particular of distance and parametrization of two curves. Note that for a given value of $t_1$ and $t_2$, there exists a unique point on the surface.

Figure 4:
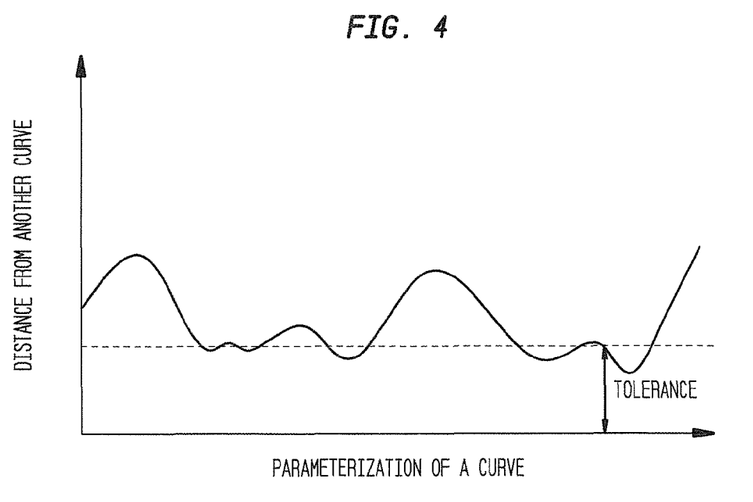
FIG. 4 illustrates a 2D plot between distance of a point on one curve and the parametrization of the other curve.

All points on the surface of the 3D plot which appear below the plane defined at d=tol are intersection points which honor the tolerance tol. FIG. 4 illustrates an example of cross-section this surface by planes which are parallel to the $t_1$ and $t_2$ axes, and in particular of a 2D plot between distance of a point on one curve and the parameterization of the other curve.

Disclosed embodiments make use of different conditions from a graph as depicted in FIG. 4 for classifying intersections between two curves. According to the implementation described below, the intersections are classified into two types called "Crisp" and "Overlapping" (although of course these specific terms are not intended to be limiting). The type of an intersection is not just a property of the geometric proximity of two entities in a region, but also depends on how this region is identified, which in turn depends on "which" entity is used to define it. This is discussed in more detail below.

A "crisp intersection", as that term is used herein, is one where the distance between two entities in a region on either side of minima continues to increase until it is more than the specified tolerance. The minima itself should also be within the tolerance, and is also referred to herein as a "global minimum." This global minimum represents a single minimum distance between a respective point on the first element and a point on the second element, at any selected portion, that is equal to or less than the tolerance.

For such situations, the system is interested in the minima when determining the intersection, and not the points in the adjacent portions which may also lie within the specified tolerance. FIG. 2 is an example of a crisp intersection, since the distance between line 204 and arc 202 increases in either direction from the minimum distance between Lmin 216 and Amin 218 and that minimum distance is also within the tolerance 206.

Figure 5:
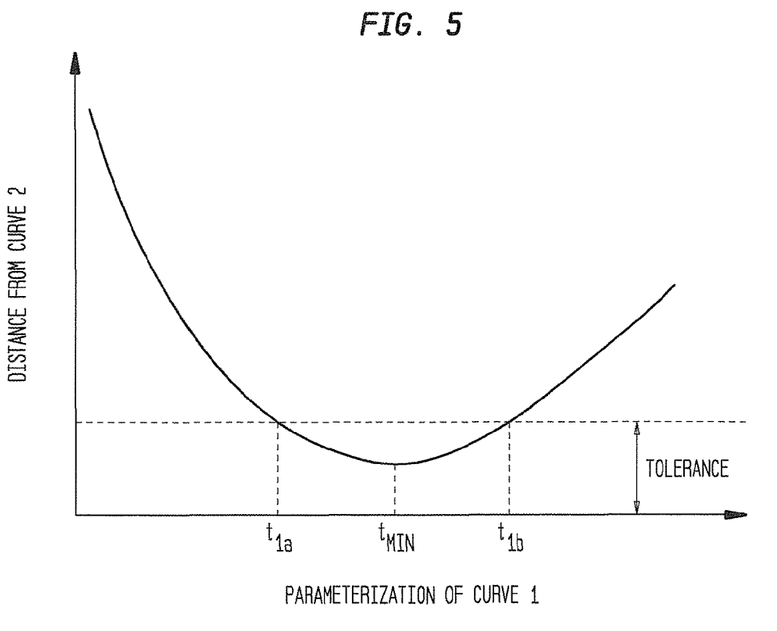
FIGS. 5 and 8 illustrate a plot of the distance from one point of one curve against the parametrization of another curve.

FIG. 5 illustrates a plot of the distance from a point on curve 2 against the span of curve 1. Note that initially the distance decreases continuously and becomes less than the specified tolerance at a point corresponding to the parameter $t_{1a}$. It becomes numerically minimum at a point corresponding to parameter $t_{min}$ and again increases continuously to go beyond the specified tolerance at a point corresponding to the parameter $t_{1b}$. This is an example of a single crisp intersection between curve 1 and curve 2 when found over the parameterization of curve 1.

By applying the definition of crisp intersection to the example in FIG. 2, the system can ensure that a single intersection point of interest is returned instead of a band on each curve. Between the region from point $A_A$ 212 to point $A_B$ 214 on the arc 202 the distance graph from Lmin 216 on the line 204 follows the nature of crisp intersection defined above. The distance corresponding to $t_{min}$ is non-zero for this example and occurs at point $A_{min}$ 218.

Figure 6:
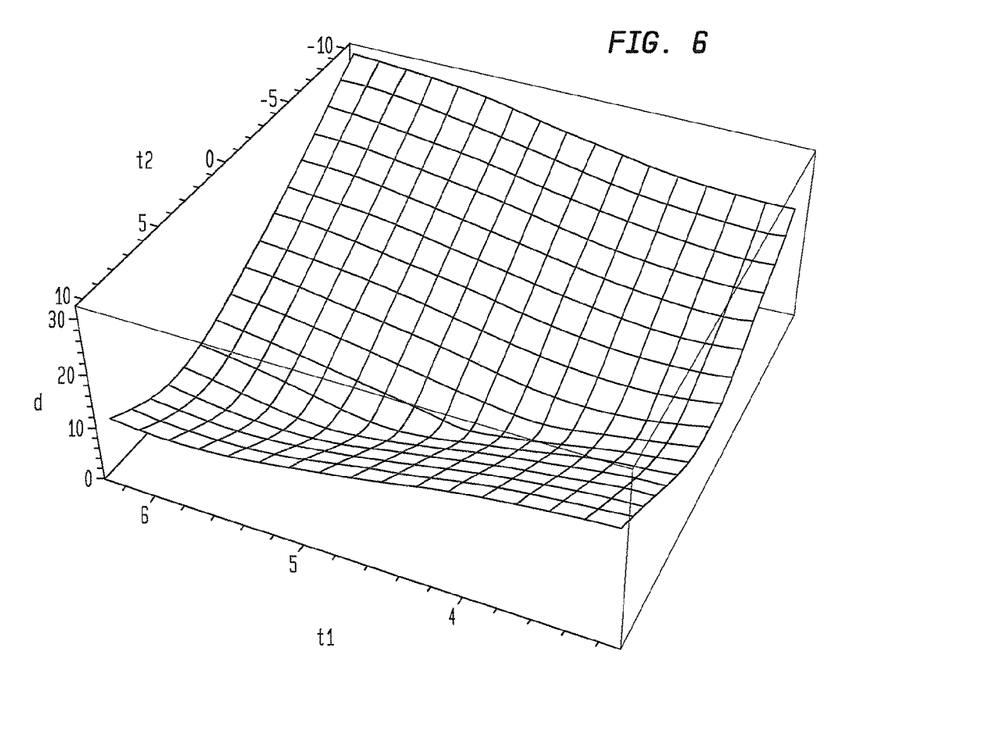
FIG. 6 illustrates a 3D plot of the distance and parameterization corresponding to FIG. 2.

FIG. 6 illustrates a 3D plot of the distance and parameterization for the scenario in FIG. 2. There is a very well defined combination of parameters $t_{1min}$ and $t_{2min}$ at the minima.

Figure 7:
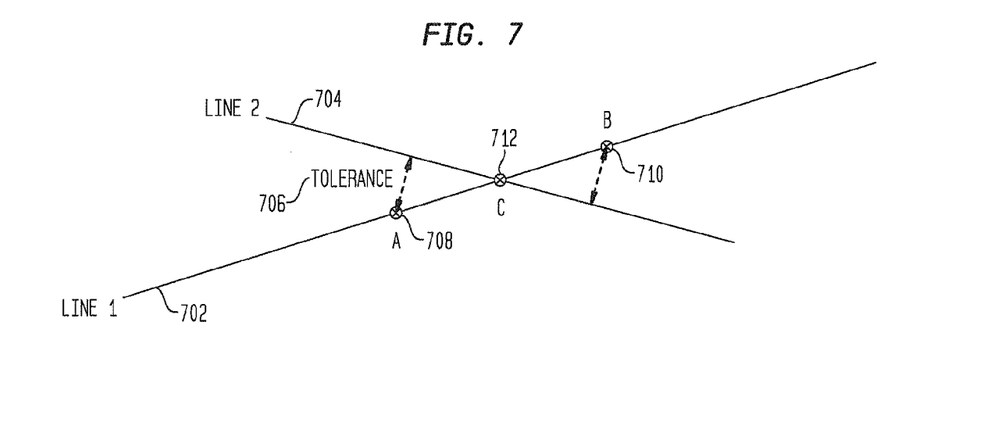
FIG. 7 shows an example using two coplanar lines.

The definition for a crisp intersection also holds true for cases when there is an actual mathematical intersection. FIG. 7 shows an example using two coplanar lines Line 1 702 and Line 2 704. Mathematically, they intersect at exactly one point C. However, the entire region from point A 708 to point B 710 that lies on Line 1 702 is within the tolerance 706 specified for finding intersections. The intersection on Line 1 702 is "crisp" because the distance graph in the region from point A to point B follows the graph depicted in FIG. 5. The distance corresponding to $t_{min}$ is zero for this example and occurs at point C 712. Also note that the same also holds true when traversing over the region associated with Line 2 704, i.e., the intersection on Line 2 704 is crisp as well. A 3D plot of distance and parameterization, for this case would produce a surface having a single minimum as a very obvious cusp in the surface.

An "overlapping intersection", as that term is used herein, is the portion between the first minimum and the last minimum in a region where the distance between the two entities never goes beyond the specified tolerance. For such situations, the system is interested in both the minima, since these define the overlapping portion. An overlapping intersection has a region of the first element (or the selected portion of it) with a distance from the second element (or the selected portion of it) that is equal to or less than the tolerance. The region is defined by a first parameter, where the distance is equal to and then is less than the tolerance, and second parameter, where the distance is equal to and then is greater than the tolerance, such that the distance is less than the tolerance between all points within the region.

Figure 8:
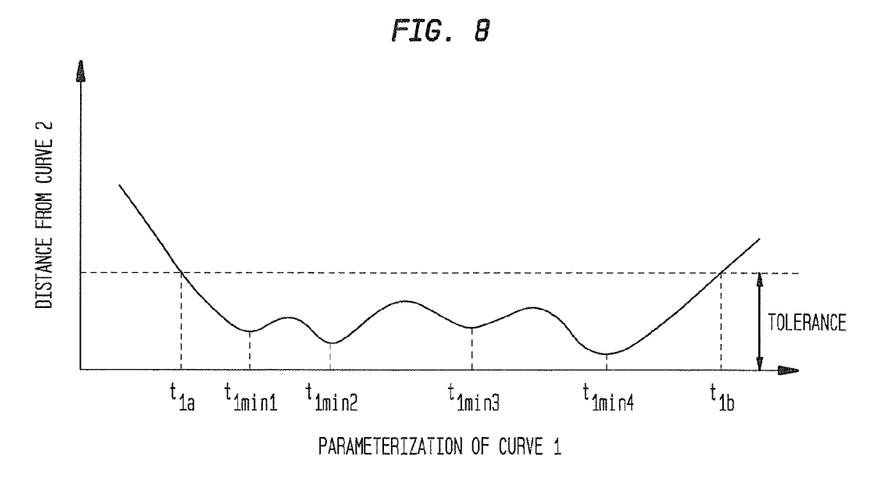

FIG. 8 illustrates a plot of the distance from a point on curve 2 against the span of a curve 1. The distance varies continuously. It becomes less than the specified tolerance at a point corresponding to parameter $t_{1a}$ and more than it at a point corresponding to parameter $t_{1b}$. In between, it continues to vary such that there is no single global minimum for this region. Instead there are multiple local minima at points corresponding to parameters $t_{1min1}$ through $t_{1min4}$. This is an example of a single overlapping intersection between curve 1 and curve 2 when found over the region associated with curve 1. The actual overlap is defined to be between points corresponding to parameters $t_{1a}$ and $t_{1b}$.

Figure 9:
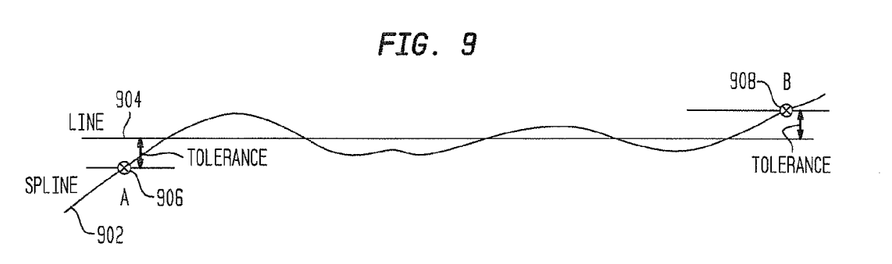
FIG. 9 shows an intersection between two coplanar curves having, overlapping intersections.

FIG. 9 shows an intersection between two coplanar curves—a spline 902 and a line 904. Note that there are a few exact mathematical solutions to the intersection problem. However, the specific area of interest with respect to intersections is the region between point A 906 and point B 908 on the Spline 902 which follows the definition of an Overlapping Intersection discussed above.

Figure 10:
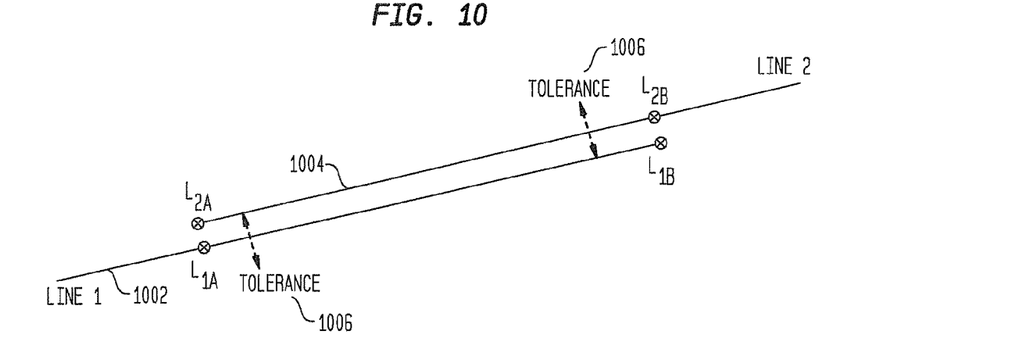
FIG. 10 shows an example using two coplanar parallel lines having partial overlap.

FIG. 10 shows an example using, two coplanar parallel lines, line 1 1002 and line 2 1004. They are apart by a distance less than the specified tolerance 1006. For this case, neither can a single intersection point be returned (because there is no global minimum) nor can the system effectively post-process some random sample points between the overlapping portions. The portions $L_{1A}$-$L_{1B}$ and $L_{2A}$-$L_{2B}$ are instead the areas of interest and constitute overlapping intersections between the Lines when defined over the parameterization of Line1 and Line2 respectively.

Figure 11:
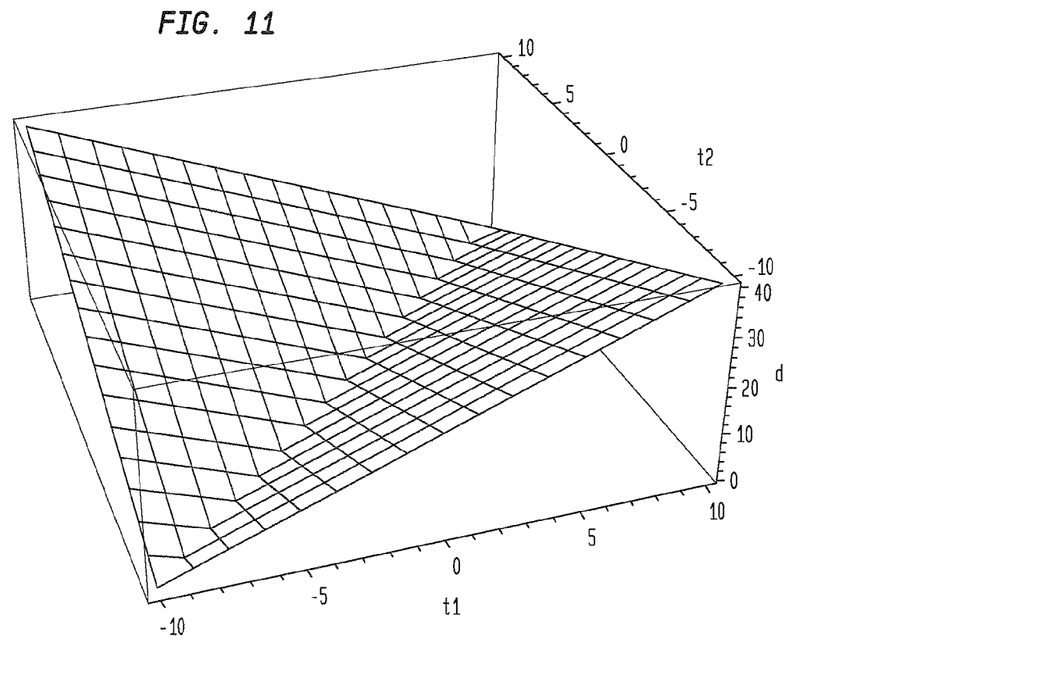
FIG. 11 illustrates a 3D plot of distance and parameterization for the parallel lines of FIG. 10.

FIG. 11 illustrates a 3D plot of distance and parameterization for the parallel lines of FIG. 10. There is no single minima in the surface. Instead, the crease in the surface indicates the extents of overlap and hence an overlapping intersection between the two lines.

Figure 12:
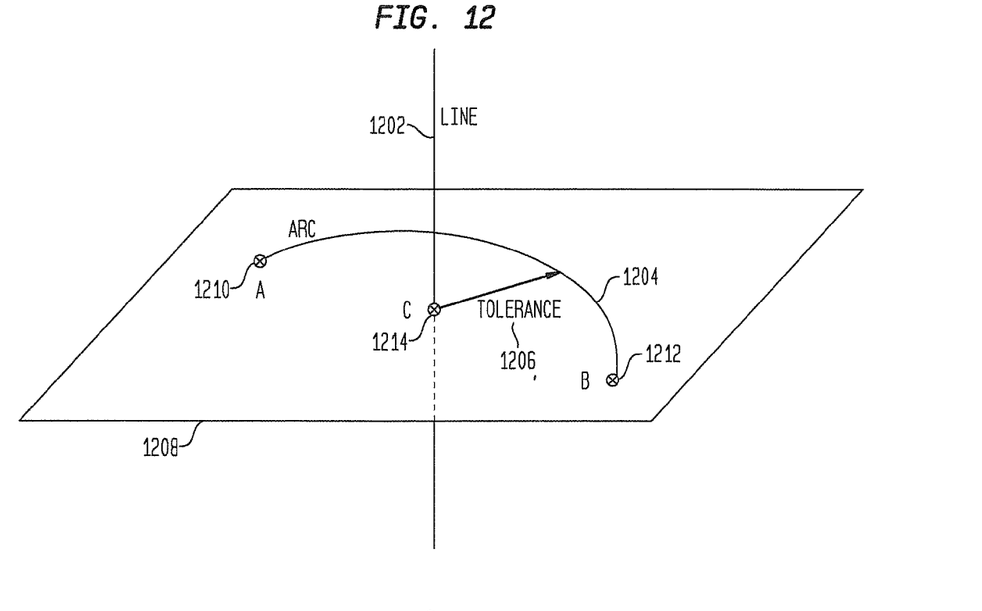
FIG. 12 illustrates an example of a mixed intersection.

For the same set of curves, an intersection can be both "crisp" and "overlapping" based on which region is used to define the intersection, and is referred to as a "mixed intersection" herein. FIG. 12 illustrates an example of a mixed intersection. The line 1202 and arc 1204 are not coplanar. The arc 1204 lies in a horizontal plane 1208 while the line is normal to the plane 1208. The radius of the arc 1204 is the same as the specified tolerance 1206.

When moving over the region from point A 1210 to point B 1212 on the arc 1204, the graph follows the nature as discussed in FIG. 8, above. Hence, the intersection associated with this region is an overlapping intersection.

When moving over the line 1202, all the points except point C 1214 are away from the arc 1204 by more than the specified tolerance 1206. There is a single minimum at point C 1214. The graph follows the nature as discussed with respect to FIG. 5. Hence, the intersection associated with the region of the line 1202 is a crisp intersection. The distance corresponding to $t_{min}$ is non-zero for this example and occurs at point C 1214.

Figure 13:
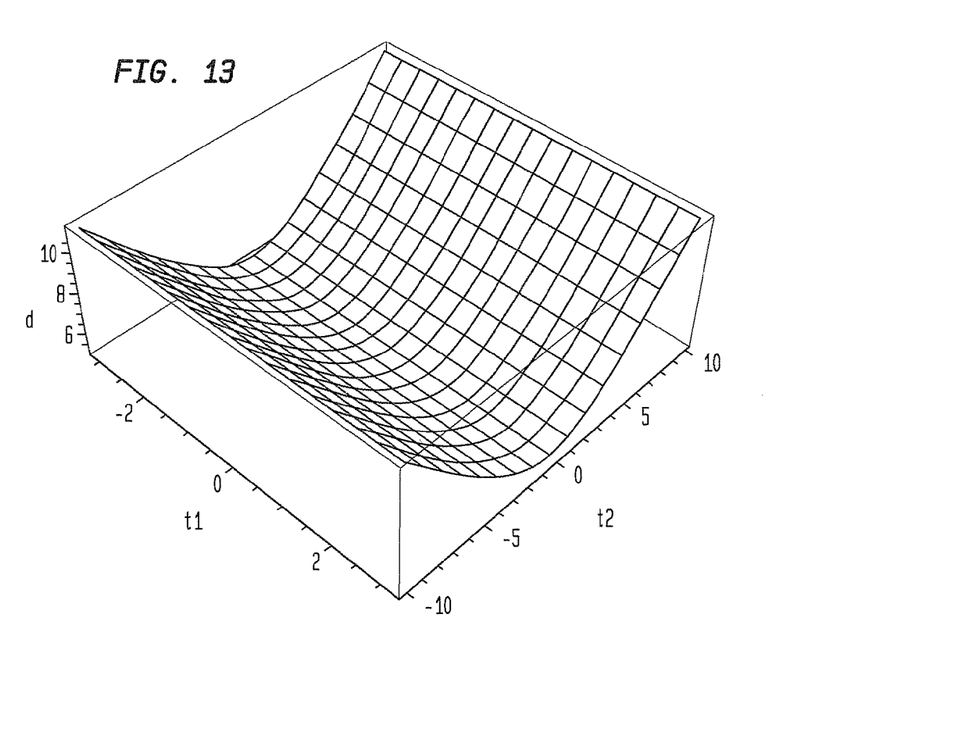
FIG. 13 illustrates a 3D plot of distance and parameterization corresponding to FIG. 12.

FIG. 13 illustrates a 3D plot of distance and parameterization corresponding to FIG. 12. The crease in the surface indicates the extents of overlap on the arc 1204 while the U-shape indicates the crisp intersection on the line 1202.

Figure 14:
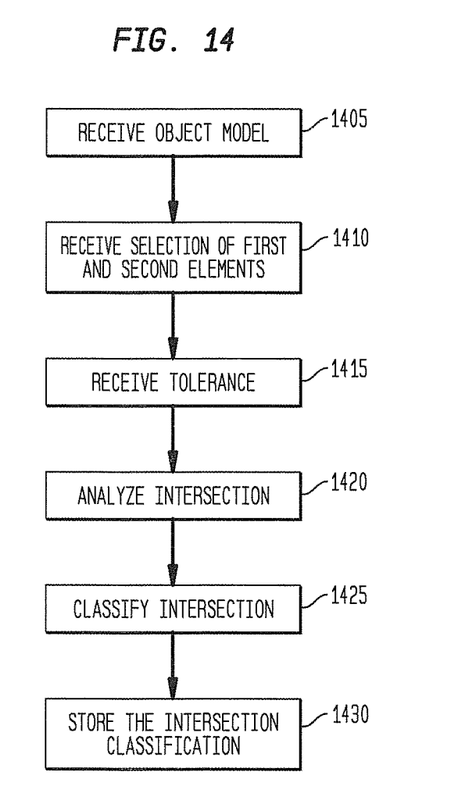
FIG. 14 depicts a flowchart of a process in accordance with disclosed embodiments.

FIG. 14 depicts a flowchart of a process in accordance with disclosed embodiments that may be performed, for example, by a PLM, PDM, CAD, or other data processing system.

The system receives an object model having a plurality of elements (step 1405). Receiving, as used herein, can include loading from a storage, receiving from another system or process, receiving via an interaction with a user, and otherwise. Each of the elements can be, for example, a plane, curve, face, or other feature of the object model. The elements each correspond to a plurality of points in a multi-dimensional space.

The system receives a selection of a first element and a second element of the plurality of elements (step 1410). This step can also include a selection of portions of one or both of the selected elements for which an intersection is to be determined and classified.

The system receives a tolerance (step 1415).

The system analyzes an intersection between the first element and the second element based on the tolerance (step 1420). This step can include determining all distances between each pair of points on the first and second elements and comparing the distances to the tolerance, and can be based on the selected portions of the selected elements rather than the entirety of the first and second elements. This step can include producing a three-dimensional (3D) plot of the distance and parameterization between the first and second elements, and can include optionally displaying the 3D plot to a user. This analysis can be performed with respect to a specified one of the first element and the selected element. For example, the system can receive a user selection specifying one of the elements, and can perform the classification below based on the "perspective" of that element. This is particularly useful for mixed intersections, where the classification is different from the perspectives of the two elements.

The system classifies the intersection between the first element and the second element based on the analysis (step 1425). The classification can include classifying the intersection as not an intersection when the distance between every point on the first element and every point on the second element, at any selected portion, is greater than the tolerance.

The classification can include classifying the intersection on each element as a crisp intersection when there is a single minimum distance between a respective region of the element and a point on the other element, at any selected portion, that is equal to or less than the tolerance. The points of the single minimum distance on each entity are the desired intersection points.

The classification can include classifying the intersection on each element as an overlapping intersection when there is a region of the element (or the selected portion of it) with a distance from the other element (or the selected portion of it) that is equal to or less than the tolerance. The region is defined by a first parameter, where the distance is equal to and then is less than the tolerance, and second parameter, where the distance is equal to and then is greater than the tolerance, such that the distance is less than the tolerance between all points within the region.

The classification can include classifying the intersection as a mixed intersection when the intersection on one element is classified as crisp and the intersection on the other element is classified as overlapping.

The system can classify the intersection with respect to a given curve or other element, as described above. For example, in the context of FIG. 12, system can classify the intersection as overlapping with respect to the arc and crisp with respect to the line, or can classify the intersection as a mixed intersection. The processes described herein result in consistency and repeatability of the generated intersection information, two very important aspects of geometric modeling.

The system stores the classification (step 1430). This step can include displaying the classification to a user, displaying the global minimum, displaying the first and second minimums, or displaying portions of the first and second elements that are within the tolerance.

Various embodiments disclosed herein classify intersections as a function not only of the geometric proximity but also of which entity is used to define it; such an approach is very relevant and applicable for tolerant intersection calculations. Disclosed techniques can be used, for example, to simulate commutative intersection calculations with reduced noise in the results, increase update robustness of a CAD model.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of a instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method performed by a data processing system and comprising:
   receiving, by the data processing system, an object model having a plurality of elements, the elements corresponding to a plurality of points;

receiving, by the data processing system, a selection of a first curve and a second curve of the plurality of elements;

receiving a tolerance by the data processing system;

analyzing, by the data processing system, an intersection between the first curve and the second curve based on determining all distances between each point on the first curve to every point on the second curve and comparing the distances to the tolerance;

classifying, by the data processing system, the intersection between the first curve and the second curve based on the analysis, wherein classifying the intersection includes classifying the intersection as a crisp intersection when there is a single minimum distance between a point on a specified curve and a non-specified curve that is equal to or less than the tolerance, wherein classifying the intersection includes classifying the intersection as an overlapping intersection when there is a region of the specified curve with a distance from the non-specified curve that is equal to or less than the tolerance, wherein classifying the intersection includes classifying the intersection as a mixed intersection when the intersection is a crisp intersection when the first curve is the specified curve and is an overlapping intersection when the second curve is the specified curve; and storing, in a memory, the classification.

2. The method of claim 1, wherein receiving the selection of the first curve and the second curve includes receiving a selection of portions of one or both of the first curve and the second curve for which the intersection is to be determined and classified.

3. The method of claim 1, wherein analyzing the intersection includes producing a three-dimensional (3D) plot of distance and parameterization between the first curve and the second curve.

4. The method of claim 3, further comprising displaying the 3D plot to a user.

5. A data processing system comprising:
a processor; and
an accessible memory, the data processing system particularly configured to:
receive, by the data processing system, an object model having a plurality of elements, the elements corresponding to a plurality of points;
receive, by data processing system, a selection of a first curve and a second curve of the plurality of elements;
receive a tolerance by data processing system;
analyze, by the processor, an intersection between the first curve and the second curve based on determining all distances between each point on the first curve to every point on the second curve and comparing the distances to the tolerance;
classify, by the processor, the intersection between the first curve and the second curve based on the analysis,
wherein classifying the intersection includes classifying the intersection as a crisp intersection when there is a single minimum distance between a span on a specified curve and a non-specified curve that is equal to or less than the tolerance,
wherein classifying the intersection includes classifying the intersection as an overlapping intersection when there is a region of the specified curve with a distance from the non-specified curve that is equal to or less than the tolerance,
wherein classifying the intersection includes classifying the intersection as a mixed intersection when the intersection is a crisp intersection when the first curve is the specified curve and is an overlapping intersection when the second curve is the specified curve; and
store the classification in the memory.

6. The data processing system of claim 5, wherein receiving the selection of the first curve and the second curve includes receiving a selection of portions of one or both of the first curve and the second curve for which the intersection is to be determined and classified.

7. The data processing system of claim 5, wherein analyzing the intersection includes producing a three-dimensional (3D) plot of distance and parameterization between the first curve and the second curve.

8. The data processing system of claim 7, further configured to display the 3D plot to a user.

9. A non-transitory computer-readable medium encoded with executable instructions that, when executed, cause one or more data processing systems to:
receive, by the one or more data processing systems, an object model having a plurality of elements, the elements corresponding to a plurality of points;
receive, by the one or more data processing systems, a selection of a first curve and a second curve of the plurality of elements;
receive a tolerance by the one or more data processing systems;
analyze, by the one or more data processing systems, an intersection between the first curve and the second curve based on determining all distances between each point on the first curve to every point on the second curve and comparing the distances to the tolerance;
classify, by the one or more data processing systems, the intersection between the first curve and the second curve based on the analysis,
wherein classifying the intersection includes classifying the intersection as a crisp intersection when there is a single minimum distance between a span on a specified curve and a non-specified curve that is equal to or less than the tolerance,
wherein classifying the intersection includes classifying the intersection as an overlapping intersection when there is a region of the specified curve with a distance from the non-specified curve that is equal to or less than the tolerance,
wherein classifying the intersection includes classifying the intersection as a mixed intersection when the intersection is a crisp intersection when the first curve is the specified curve and is an overlapping intersection when the second curve is the specified curve; and
store the classification in a memory of the one or more data processing systems.

10. The computer-readable medium of claim 9, wherein analyzing the intersection includes producing a three-dimensional (3D) plot of distance and parameterization between the first curve and the second curve.

11. The computer-readable medium of claim 9, wherein receiving the selection of the first curve and the second curve includes receiving a selection of portions of one or both of the first curve and the second curve for which the intersection is to be determined and classified.

* * * * *